(12) United States Patent
Lubguban, Jr. et al.

(10) Patent No.: US 8,574,675 B2
(45) Date of Patent: Nov. 5, 2013

(54) METHOD AND COMPOSITION FOR DEPOSITING RUTHENIUM WITH ASSISTIVE METAL SPECIES

(75) Inventors: Jorge A. Lubguban, Jr., Ridgefield, CT (US); Thomas M. Cameron, Newtown, CT (US); Chongying Xu, New Milford, CT (US); Weimin Li, New Milford, CT (US)

(73) Assignee: Advanced Technology Materials, Inc., Danbury, CT (US)

( * ) Notice: Subject to any disclaimer, the term of this patent is extended or adjusted under 35 U.S.C. 154(b) by 0 days.

(21) Appl. No.: 13/256,832

(22) PCT Filed: Mar. 17, 2010

(86) PCT No.: PCT/US2010/027614
§ 371 (c)(1),
(2), (4) Date: Nov. 21, 2011

(87) PCT Pub. No.: WO2010/107878
PCT Pub. Date: Sep. 23, 2010

(65) Prior Publication Data
US 2012/0064719 A1    Mar. 15, 2012

Related U.S. Application Data

(60) Provisional application No. 61/161,016, filed on Mar. 17, 2009.

(51) Int. Cl.
*C23C 16/00*    (2006.01)
*H01L 21/28*    (2006.01)

(52) U.S. Cl.
USPC ........................ 427/250; 427/248.1

(58) Field of Classification Search
None
See application file for complete search history.

(56) References Cited

U.S. PATENT DOCUMENTS

| 4,927,670 A | 5/1990 | Erbil |
| 4,948,623 A | 8/1990 | Beach et al. |
| 6,002,036 A | 12/1999 | Kadokura |
| 6,277,436 B1 | 8/2001 | Stauf et al. |

(Continued)

FOREIGN PATENT DOCUMENTS

| KR | 10-2003-0057706 | * | 7/2003 |
| KR | 10-2008-0079514 | * | 9/2008 |

(Continued)

OTHER PUBLICATIONS

Gil, KR10-2003-0057706, Jul. 2003, English machine translation.*

(Continued)

*Primary Examiner* — Joseph Miller, Jr.
(74) *Attorney, Agent, or Firm* — Hultquist, PLLC; Mary B. Grant; Maggie Chappuis

(57) ABSTRACT

A method of forming a ruthenium-containing film in a vapor deposition process, including depositing ruthenium with an assistive metal species that increases the rate and extent of ruthenium deposition in relation to deposition of ruthenium in the absence of such assistive metal species. An illustrative precursor composition useful for carrying out such method includes a ruthenium precursor and a strontium precursor in a solvent medium, wherein one of the ruthenium and strontium precursors includes a pendant functionality that coordinates with the central metal atom of the other precursor, so that ruthenium and strontium co-deposit with one another. The method permits incubation time for ruthenium deposition on non-metallic substrates to be very short, thereby accommodating very rapid film formation in processes such as atomic layer deposition.

34 Claims, 2 Drawing Sheets

(56) References Cited

U.S. PATENT DOCUMENTS

| | | | |
|---|---|---|---|
| 6,342,445 B1* | 1/2002 | Marsh | 438/681 |
| 6,440,495 B1 | 8/2002 | Wade et al. | |
| 6,479,100 B2 | 11/2002 | Jin et al. | |
| 6,506,666 B2 | 1/2003 | Marsh | |
| 6,680,251 B2 | 1/2004 | Won et al. | |
| 6,743,739 B2 | 6/2004 | Shimamoto et al. | |
| 6,849,122 B1 | 2/2005 | Fair | |
| 6,984,591 B1* | 1/2006 | Buchanan et al. | 438/778 |
| 7,211,509 B1* | 5/2007 | Gopinath et al. | 438/650 |
| 7,285,308 B2 | 10/2007 | Hendrix et al. | |
| 7,300,038 B2 | 11/2007 | Gregg et al. | |
| 7,635,441 B2 | 12/2009 | Kadokura et al. | |
| 8,034,407 B2 | 10/2011 | Hendrix et al. | |
| 8,092,721 B2 | 1/2012 | Gatineau et al. | |
| 2002/0146513 A1 | 10/2002 | Jin et al. | |
| 2003/0020122 A1* | 1/2003 | Joo et al. | 257/381 |
| 2003/0129306 A1* | 7/2003 | Wade et al. | 427/255.28 |
| 2003/0165615 A1 | 9/2003 | Aaltonen et al. | |
| 2003/0205823 A1* | 11/2003 | Leu et al. | 257/774 |
| 2004/0166671 A1 | 8/2004 | Lee et al. | |
| 2004/0214354 A1* | 10/2004 | Marsh et al. | 438/3 |
| 2005/0153073 A1* | 7/2005 | Zheng et al. | 427/248.1 |
| 2005/0186341 A1 | 8/2005 | Hendrix et al. | |
| 2006/0118968 A1* | 6/2006 | Johnston et al. | 257/775 |
| 2006/0128150 A1 | 6/2006 | Gandikota et al. | |
| 2007/0054487 A1 | 3/2007 | Ma et al. | |
| 2007/0116888 A1* | 5/2007 | Faguet | 427/569 |
| 2007/0190362 A1* | 8/2007 | Weidman | 428/701 |
| 2008/0242111 A1* | 10/2008 | Holme et al. | 438/778 |
| 2008/0254232 A1* | 10/2008 | Gordon et al. | 427/585 |
| 2008/0317972 A1* | 12/2008 | Hendriks et al. | 427/569 |
| 2009/0002917 A1* | 1/2009 | Kil et al. | 361/305 |
| 2010/0015800 A1* | 1/2010 | Hara et al. | 438/653 |
| 2010/0095865 A1 | 4/2010 | Xu et al. | |
| 2010/0291299 A1 | 11/2010 | Cameron et al. | |
| 2011/0195188 A1 | 8/2011 | Hendrix et al. | |

FOREIGN PATENT DOCUMENTS

| | | | |
|---|---|---|---|
| SU | 768457 A | | 10/1980 |
| WO | 0015865 A1 | | 3/2000 |
| WO | WO2007/064376 | * | 6/2007 |
| WO | 2008088563 A2 | | 7/2008 |
| WO | WO2008/117582 | * | 10/2008 |
| WO | 2009020888 A1 | | 2/2009 |

OTHER PUBLICATIONS

Lee, KR10-2008-0079514, Sep. 2008, English machine translation.*
Lee, KR10-2008-0079514, Sep. 2008, English Human translation of paragraph 33.*
Anderson, Q., et al., "Synthesis and Characterization of the First Pentaphenylcyclopentadienyl Copper(I) Complex, (Ph5CP)Cu(PPh3)", "Organometallics ", 1998, pp. 4917-4920, vol. 17.
Artaud-Gillet, M., et al., "Evaluation of copper organometallic sources for CuGaSe2 photovoltaic applications", "Journal of Crystal Growth", 2003, pp. 163-168, vol. 248.
Macomber, D., et al., "(n5-Cyclopentadienyl)- and (n5-Pentamethylcyclopentadienyl)copper Compounds Containing Phosphine, Carbonyl, and n2-Acetylenic Ligands", "J. Am. Chem. Soc.", 1983, pp. 5325-5329, vol. 105.
Papadatos, F., et al., "Characterization of Ruthenium and Ruthenium Oxide Thin Films deposited by Chemical Vapor Deposition for CMOS Gate Electrode Applications", "Mat. Res. Soc. Symp. Proc.", 2003, pp. N3.3.1-N3.3.6, vol. 745.
Ren, H., et al., "Synthesis and structures of cyclopentadienyl N-heterocyclic carbene copper(I) complexes", "Journal of Organometallic Chemistry", 2006, pp. 4109-4113, vol. 691.
Christen, H., et al., "Semiconducting epitaxial films of metastable SrRu0.5Sn0.5O3 grown by pulsed laser deposition", "Applied Physics Letters", 1997, pp. 2147-2149 (Title and Abstract), vol. 70, No. 16.
Kvyatkovskii, O., "On the Nature of Ferroelectricity in Sr1-xAxTiO3 and KTa1-xNbxO3 Solid Solutions", "Physics of the Solid State", 2002, pp. 1135-1144, vol. 44, No. 6.
Lu, H., et al., "Evolution of itinerant ferromagnetism in SrxPb1-xRuO3 ($0 \leq x \leq 1$): Interplay between Jahn-Teller distortion and A-site disorder", "Applied Physics Letters", Mar. 22, 2011, pp. 1-3, vol. 98, No. 122503.
Niinistoe, J., et al., "Atomic Layer Deposition of High-k Oxides of the Group 4 Metals for Memory Applications", "Advanced Engineering Materials", Mar. 9, 2009, pp. 223-234, vol. 11, No. 4.
Wu, L., et al., "Humidity Sensitivity of Sr(Sn, Ti)O3 Ceramics", "Journal of Electronic Materials", 1990, pp. 197-200, vol. 19, No. 2.

* cited by examiner

METHOD AND COMPOSITION FOR DEPOSITING RUTHENIUM WITH ASSISTIVE METAL SPECIES

CROSS-REFERENCE TO RELATED APPLICATIONS

This is a U.S. national phase under the provisions of 35 U.S.C. §371 of International Patent Application No. PCT/US10/27614 filed Mar. 17, 2010, which in turn claims the benefit of priority under 35 U.S.C. §119 of U.S. Provisional Patent Application No. 61/161,016 filed Mar. 17, 2009. The disclosures of such international patent application and U.S. provisional patent application are hereby incorporated herein by reference in their respective entireties, for all purposes.

FIELD

The present invention relates to compositions and processes for fabricating ruthenium-containing films on substrates, e.g. in the manufacture of microelectronic devices and device precursor structures therefor.

DESCRIPTION OF RELATED ART

In the manufacture of advanced microelectronic devices, ruthenium is an increasingly important material of construction, e.g., for forming electrodes in dynamic random access memory (DRAM) devices. Ruthenium electrodes can for example be utilized in the fabrication of capacitors, such as those based on strontium titanate (STO) and barium strontium titanate (BST).

It nonetheless is difficult to deposit ruthenium metal at the aspect ratios that are necessary in many vapor deposition processes, such as atomic layer deposition (ALD), when using conventional ruthenium precursor materials. In particular, ALD deposition of ruthenium metal suffers the disadvantages of excessively long incubation time (the duration required for ruthenium to nucleate or aggregate to a sufficient extent for film growth to begin), roughness of the resulting film, low precursor utilization efficiency, and high overall process cost.

The art therefore continues to seek improved compositions and deposition processes for vapor-phase formation of ruthenium-containing films, in applications such as fabrication of ruthenium electrodes for the manufacture of microelectronic devices.

SUMMARY

The present invention relates to compositions and processes for deposition of ruthenium-containing material, as useful in applications such as fabrication of ruthenium-based electrodes in microelectronic devices such as DRAM capacitors.

In one aspect, the invention relates to a method of forming a ruthenium-containing film in a vapor deposition method, comprising depositing ruthenium with an assistive metal species that increases the rate and extent of ruthenium deposition in relation to deposition of ruthenium in the absence of such assistive metal species.

A further aspect of the invention relates to a method of forming a ruthenium-containing film in a vapor deposition process, comprising depositing ruthenium with an assistive metal species that increases the rate and extent of ruthenium nucleation in relation to deposition of ruthenium in the absence of such assistive metal species.

In another aspect, the invention relates to a method of forming a ruthenium-containing film in a vapor deposition method, comprising co-depositing ruthenium and an assistive metal species that increases the rate and extent of ruthenium deposition in relation to deposition of ruthenium in the absence of such assistive metal species, wherein one of the ruthenium and assistive metal species precursors includes a pendant functionality that coordinates with the central metal atom of the other precursor.

In a further aspect, the invention relates to a precursor composition comprising a ruthenium precursor and an assistive metal species precursor, wherein one of the ruthenium and assistive metal species precursors includes a pendant functionality that coordinates with the central metal atom of the other precursor, so that ruthenium and the assistive metal species co-deposit with one another.

In a further aspect, the invention relates to a precursor composition comprising a ruthenium precursor and an assistive metal species precursor, in a solvent medium, wherein one of the ruthenium and assistive metal species precursors includes a pendant functionality that coordinates with the central metal atom of the other precursor, so that ruthenium and the assistive metal species co-deposit with one another.

In another aspect, the invention relates to precursor composition comprising a dicyclopentadienyl strontium compound, a dicyclopentadienyl ruthenium compound, and a solvent medium, wherein the dicyclopentadienyl ruthenium compound includes a Lewis base functional group on at least one of its cyclopentadienyl rings that coordinates with the strontium metal center of the dicyclopentadienyl strontium compound.

The invention in a further aspect relates to a composition comprising a ruthenium precursor and an assistive metal species precursor, wherein the composition comprises at least one precursor of the formula selected from the group consisting of:

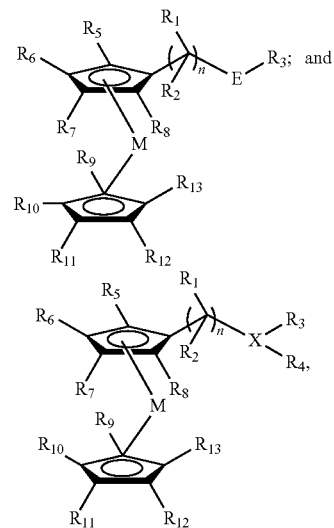

wherein:
E is O or S;
X is N;
M is ruthenium, strontium, barium or calcium; and
each of $R_1$ to $R_{13}$ can be the same as or different from one another, and each is independently selected from hydrogen, methyl, ethyl and propyl.

In a further aspect, the invention relates to a composition comprising bis (n-propyl tetramethyl cyclopentadienyl) strontium and ethylmethyl amino ethyl cyclopentadienyl ruthenium dicyclopentadiene.

Additional aspects, features and embodiments of the invention will be more fully apparent from the ensuing disclosure and appended claims.

DETAILED DESCRIPTION

Figure 1:
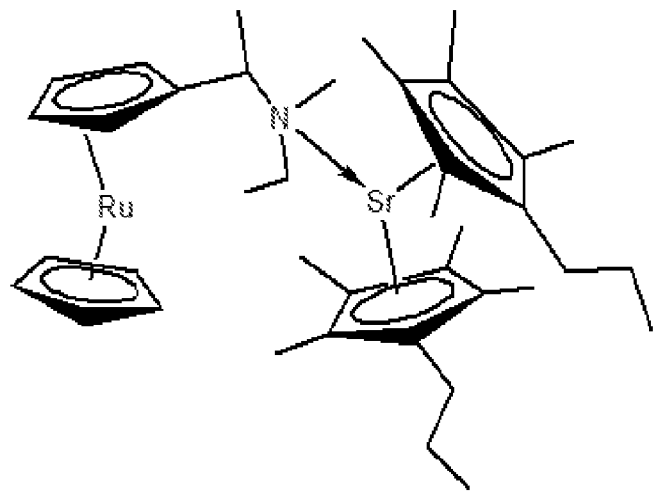
FIG. 1 is a schematic representation of coordinative interaction between a dicyclopentadienyl strontium precuror and a dicyclopentadienyl ruthenium precursor wherein the ruthenium precursor includes a cyclopentadienyl-pendant aminoalkyl Lewis base group that is capable of coordinating with the strontium metal center of the strontium precursor.

The present invention relates to compositions and processes for depositing ruthenium in a highly efficient manner, which is well-suited to deposition of ruthenium on non-metal substrates such as silicon, silicon dioxide, silicon carbide, and other non-conductive semiconductor manufacturing substrates. In application to such non-metal substrates, the compositions and methods of the invention provide short or even negligible incubation periods, in contrast to the long incubation times required by prior art ruthenium compositions and deposition methods.

In a broad aspect, the invention contemplates deposition of ruthenium with an assistive metal species that increases the rate and extent of ruthenium deposition over a corresponding deposition in the absence of such assistive metal species. Ruthenium can be deposited on a film containing the assistive metal species, or ruthenium can be concurrently deposited with the assistive metal species, i.e., both concurrent and subsequent deposition of ruthenium (relative to the assistive metal deposition) is contemplated within the meaning of the term "deposition of ruthenium with an assistive metal species."

The invention therefore contemplates a method of forming a ruthenium-containing film in a vapor deposition process, comprising depositing ruthenium with an assistive metal species that increases the rate and extent of ruthenium nucleation in relation to deposition of ruthenium in the absence of such assistive metal species.

In such method, the ruthenium nucleation step is uniform and rapid relative to ruthenium nucleation in the absence of the assistive metal species.

As used herein, the term "assistive metal species" refers to a metal or metal-containing material, wherein the metal in such material includes at least one metal species selected from the group consisting of strontium, calcium, barium, magnesium, titanium, aluminum, zirconium, tantalum, niobium, vanadium, iron and hafnium.

The assistive metal species employed when the ruthenium is deposited thereon, may comprise one or more of the foregoing metals as an elemental metal film, or as an oxygen-containing compound, e.g., an oxide or carbonate of such metal species. Illustrative examples of such oxygen-containing assistive metal species include strontium oxide, strontium carbonate, calcium oxide, calcium carbonate, magnesium oxide, magnesium carbonate, barium oxide, barium carbonate, titanium dioxide, aluminum, zirconium oxide, hafnium oxide, tantalum oxide, niobium oxide, vanadium oxide, iron oxide, and the like.

Preferred assistive metal species include strontium oxide and/or strontium carbonate, which may for example form a thin film on a substrate, to act as a nucleation, seed or interlayer on which ruthenium can be readily deposited, even on non-metal substrates such as silicon, silicon dioxide, silicon carbide, etc., on which ruthenium otherwise requires an extremely long incubation time for nucleation.

By way of example, deposition of ruthenium on a silicon or silicon oxide substrate using conventional ruthenium precursors and deposition techniques may require from 200 to 500 pulses in an atomic layer deposition process, in order for ruthenium nucleation to occur and film growth to begin. The use of assistive metal species in accordance with the invention overcomes such deficiency, and enables ruthenium to be deposited in substantially less time, e.g., 20 to 40 pulses, thereby substantially increasing the deposition efficiency of the ALD system.

The assistive metal species when employed as a co-deposited material with the ruthenium may take the form of an organometal precursor that is alternated with a ruthenium precursor in an ALD process, so that each of the precursors is alternatively contacted with a substrate at elevated temperature. Alternatively, such assistive material may be used in mixture with the ruthenium precursor as a solid source material or in a cocktail composition in one or more solvents for co-deposition of ruthenium and the assistive metal species.

In one embodiment, the invention contemplates a ruthenium precursor and an assistive metal species precursor, wherein one of the ruthenium and assistive metal species precursors includes a pendant functionality that coordinates with the central metal atom of the other precursor, so that ruthenium and the assistive metal species co-deposit with one another.

For example, the composition can comprise a ruthenium precursor and an assistive metal species precursor, wherein the composition comprises at least one precursor of the formula selected from the group consisting of:

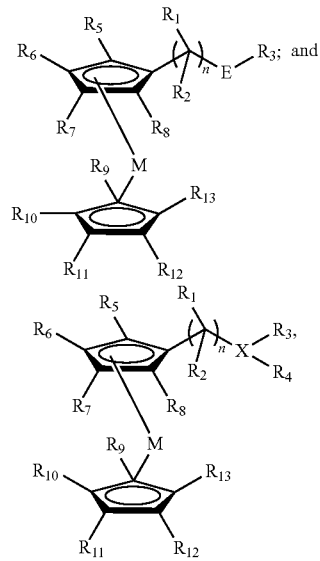

wherein:

E is O or S;

X is N;

M is ruthenium, strontium, barium or calcium; and each of $R_1$ to $R_{13}$ can be the same as or different from one another, and each is independently selected from hydrogen, methyl, ethyl and propyl.

In another embodiment, the assistive metal precursor and ruthenium precursor are both present in a solvent medium that is volatilized and transported to the vapor deposition chamber for contacting with a substrate at suitable elevated temperature to deposit ruthenium and the assistive metal species on the substrate.

In such a solvent solution, it is useful to utilize an assistive metal precursor with a ruthenium precursor, wherein one of such precursors has a pendant functionality that coordinates with the central metal atom of the other precursor, so that ruthenium and the assistive metal species more readily co-deposit with one another.

As an example, the precursor composition may contain a dicyclopentadienyl strontium compound, a dicyclopentadienyl ruthenium compound, and a solvent medium, wherein the dicyclopentadienyl ruthenium compound includes a Lewis base functional group on at least one of its cyclopentadienyl rings, that coordinates with the strontium metal center of the dicyclopentadienyl strontium compound. A particularly preferred composition of such type comprises bis(n-propyl tetramethyl cyclopentadienyl) strontium and ethylmethyl amino ethyl cyclopentadienyl ruthenium dicyclopentadiene in a hydrocarbon solvent.

Such precursor composition may be volatilized at suitable temperature to form a precursor vapor that is transported to the vapor deposition chamber for contacting with the substrate at elevated temperature, to form a ruthenium-containing film on the substrate, wherein the film also contains the assistive metal.

When the assistive metal is deposited on the substrate, it forms nucleation sites for ruthenium deposition and film growth. Ruthenium and the assistive metal may be deposited sequentially, with the assistive metal being deposited on the surface in a pulsed contacting mode, to provide the assistive metal interlayer, on which ruthenium then is deposited from the ruthenium-containing precursor vapor.

On non-metallic substrates such as silica or silicon, in ALD process applications, it has been found that a thin layer of strontium-containing material, e.g., strontium oxide and/or strontium carbonate, is effective to substantially instantly eliminate the extended incubation period of ruthenium on the substrate that would obtain in the absence of such strontium-containing layer.

Thus, the assistive metal-containing interfacial layer is advantageously deposited on the substrate before the deposition of ruthenium in an ALD process, so that the interfacial layer acts as a nucleation layer or seed layer or bridging layer on the substrate so that ruthenium then is able to efficiently deposit on the interfacial layer. The interfacial layer may be of any suitable thickness, typically being only several Angstroms thick in order to provide superior film growth of ruthenium.

The interfacial layer may be formed in any suitable manner. In one embodiment, the deposition is carried out, with ozone, water or an alcohol being present and forming an oxide of the assistive metal, and ruthenium-containing material being deposited on the oxide of the assistive metal. In another embodiment, the deposition is conducted with an agent selected from the group consisting of ammonia, hydrogen, boranes, and carbon monoxide being present to facilitate deposition of assistive metal-containing material, and ruthenium-containing material being deposited on the assistive metal-containing material.

As a specific example, an assistive metal oxide can be formed on a substrate such as a silicon, silicon dioxide, or other insulative or non-conductive surface, e.g., in 1 to 5 pulses of a strontium precursor, to form a very thin layer of strontium oxide, followed by deposit of ruthenium on the strontium oxide layer. This arrangement significantly reduces incubation time for ruthenium-containing film formation. Without such strontium oxide deposition, the formation of a ruthenium-containing film does not occur.

As a further example, such interfacial layer deposition processing has been carried out in a cycle involving pulsed introduction of bis(n-propyl tetramethyl cyclopentadienyl) strontium followed by a pulse of ozone after intergas purge, wherein the pulse of the strontium material is sufficient to initiate deposition of ruthenium with little or no incubation time. Measurements by x-ray diffraction on thicker films show that a cycle of bis (n-propyl tetramethyl cyclopentadienyl) strontium corresponds to thickness that may be on the order of 0.8 Angstrom. In such ALD process, oxygen may be pulsed instead of ozone, so long as an appropriate strontium-containing oxide layer and/or strontium carbonate layer is formed. In commercial ALD processes, 3-10 pulse cycles may be sufficient to cover the entire surface of the substrate with the interfacial material, to maximize the deposition rate of ruthenium.

When ruthenium is co-deposited with assistive metal-containing material to provide a high rate and extent of ruthenium deposition in relation to ruthenium deposition in the absence of the assistive metal-containing material, and the assistive metal and ruthenium source materials comprise organometallic compounds dissolved in a solvent medium, the respective organometallic compounds and solvent medium may be of any suitable type. The organo moiety of the organometallic compounds may comprise alkyl, aryl, cycloalkyl, amino, alkenyl, cycloalkenyl, amidinates, guanidinates, or other suitable organic substituents.

The solvent medium may comprise a single component solvent composition or a multicomponent solvent mixture in which the ruthenium and assistive metal precursors are dissolved. The solvent medium may be of any suitable type, and may for example include hydrocarbon solvents, such as alkanes (octane, decane, hexane, etc.), cyclopentadienes and their derivatives, ethers, alcohols, amines, polyamines, perfluorinated solvents, etc.

The assistive metal and ruthenium precursors in such a cocktail solution may be present at any suitable amounts that will facilitate the delivery of appropriate amounts of assistive metal and ruthenium to the growing film being formed on the substrate.

For example, when strontium and ruthenium precursors are employed, the weight ratio of strontium to ruthenium in the precursor solvent solution, $Wt_{Sr}/Wt_{Ru}$, may be in a range of from 0.8 to 1.25, more preferably in a range of from 0.9 to 1.1, and most preferably in a range of from 0.95 to 1.05. Such cocktail solution may be delivered to an ALD reactor using a vaporizer to form a precursor vapor from the solution, whereby strontium and ruthenium may be co-deposited on the substrate with pulsing of an oxygen or ozone gas so that the deposited metals form a strontium ruthenate film on the substrate.

As mentioned hereinabove, when ruthenium is deposited from a precursor composition comprising a ruthenium precursor and an assistive metal species precursor in a solvent medium, it is advantageous that one of the ruthenium and assistive metal species precursors includes a pendant functionality that coordinates with the central metal atom of the other precursor, so that ruthenium and the assistive metal species co-deposit with one another.

Such pendant coordinating functionality may be widely varied depending on the identity of the assistive metal species, and the particular ruthenium and assistive metal species precursors that are employed. In general, the coordinating functionality may contain oxygen, nitrogen or sulfur atoms as coordinating atoms, and the pendant functionality may comprise amines, polyamines, ethers, polyethers, sulfyl groups, etc., it being required only that the coordinating functionality is effective to produce enhanced deposition of ruthenium in relation to a corresponding deposition composition lacking such coordinating functionality, and otherwise compatible with the composition and deposition technique employed.

FIG. 1 illustrates a composition comprising bis (n-propyl tetramethyl cyclopentadienyl) strontium and ethylmethyl amino ethyl cyclopentadienyl ruthenium dicyclopentadiene, wherein the amino nitrogen atom coordinates to the strontium metal center so that the coordinated metals deposit efficiently with one another. For example, a 1:1 by weight mixture of bis (n-propyl tetramethyl cyclopentadienyl) strontium and ethyl methyl amino ethylcyclopentadienyl ruthenium cyclopentadiene may be employed for such purpose.

The ruthenium deposition processes and compositions of the present invention achieve extremely short or even no incubation periods for ruthenium deposition, in contrast to the extremely long time required utilizing prior art compositions and processes. Accordingly, ruthenium can be effectively deposited in a very rapid manner consistent with ALD process cycle times, even on non-metallic substrates such as silicon and/or silicon dioxide.

The ruthenium vapor deposition processes of the invention may be carried out at any suitable temperature, pressure, flow rate and compositional parameters providing effective deposition of ruthenium.

As an illustrative example, an atomic layer deposition process may be carried out at a delivery temperature of 180° C., a substrate temperature of 325° C., and a pressure of 1 torr, utilizing the ruthenium and strontium precursors shown in FIG. 1, wherein the ruthenium precursor is provided in xylene solution as a concentration of 0.2 Molar, and is delivered at a rate of 0.1 milliliter/minute, for ALD contacting periods of 10 seconds, in alternation with delivery of the strontium precursor. The strontium precursor is contacted with the substrate for 10 second intervals, except that each $4^{th}$ contact is for 20 seconds duration. Ozone is used as a co-reactant with the strontium precursor, and oxygen is used as a ruthenium co-reactant. Such ALD vapor deposition conditions have been found to provide substantial thicknesses in the range of 33 to 71 Angstroms on silicon dioxide substrates, and thicknesses of 17 to 56 Angstroms on silicon substrates. Since the strontium precursor forms an interfacial layer of strontium oxide and/or strontium carbonate, the growth of ruthenium is very rapid.

Figure 2:
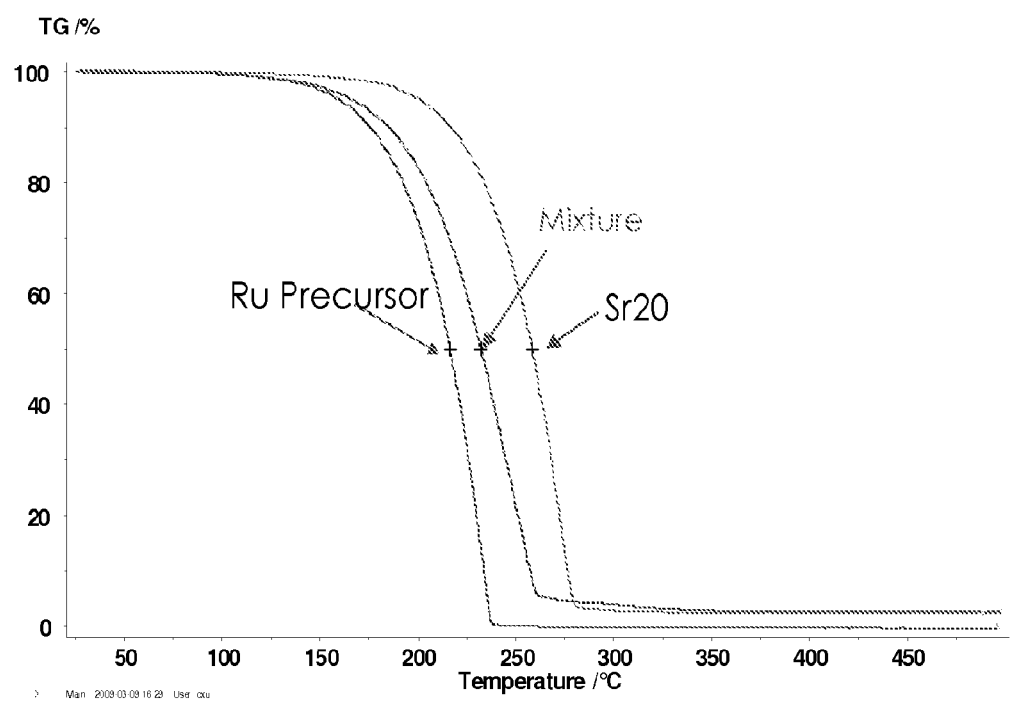
FIG. 2 is an STA plot of thermogravimetric data for a mixture of the composition of FIG. 1, and the ruthenium and strontium components thereof.

FIG. 2 is an STA plot of thermogravimetric data for a precursor composition of the type shown in FIG. 1, comprising a 1:1 by weight mixture of bis (n-propyl tetramethyl cyclopentadienyl) strontium and ethyl methyl amino ethylcyclopentadienyl ruthenium cyclopentadiene, and each of the ruthenium and strontium precursors alone. The strontium precursor bis (n-propyl tetramethyl cyclopentadienyl) strontium is denoted in such STA plot as Sr20. The STA data for the Sr20/Ru precursor mixture reflects good volatilization and transport properties.

Figure 3:
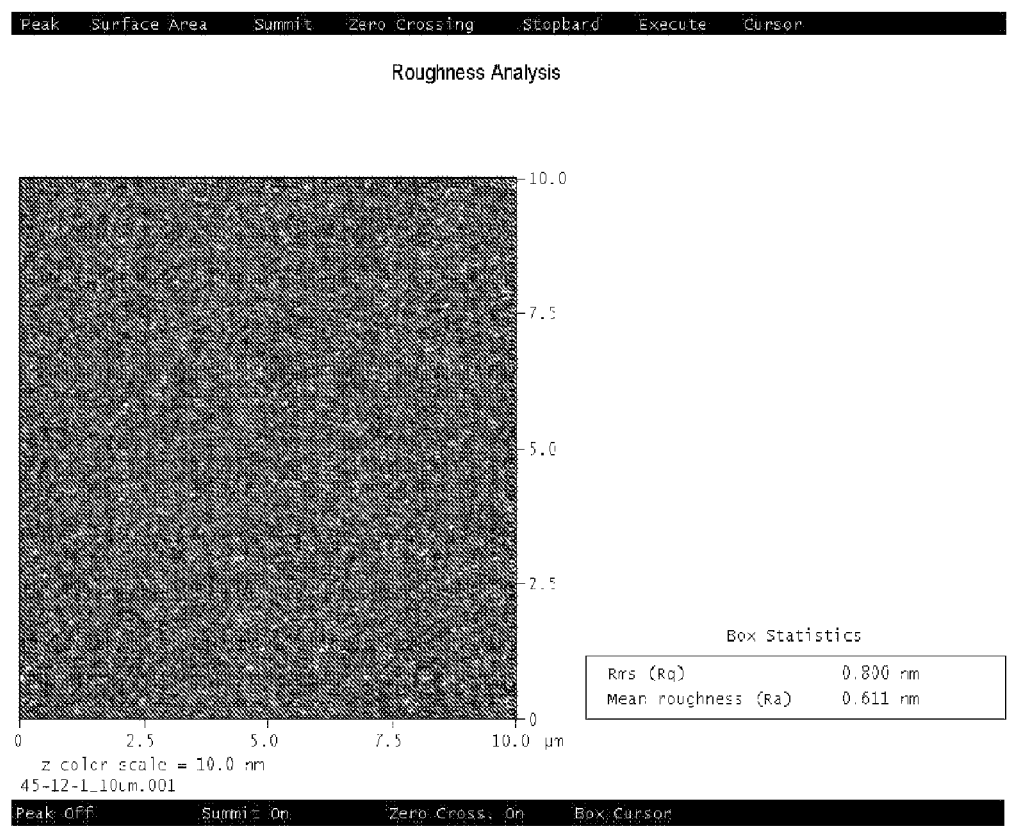
FIG. 3 is an atomic force microscope (AFM) picture of a ruthenium film deposited on a strontium oxide seed layer.

FIG. 3 is an atomic force microscope (AFM) picture of a ruthenium film deposited on a strontium oxide seed layer by ALD conducted in accordance with the present invention, utilizing ethyl methyl amino ethylcyclopentadienyl ruthenium cyclopentadiene as the ruthenium precursor, showing the film as having an Rms (Rq) characteristic of 0.800 nm and a mean roughness (Ra) of 0.611 nm. The ruthenium film therefore is very smooth and uniform in character.

INDUSTRIAL APPLICABILITY

The ruthenium precursor compositions and ruthenium film deposition methods of the invention are highly effective in producing ruthenium-containing films in a rapid manner with good resulting film characteristics. Extremely short or even no incubation periods for ruthenium deposition can be achieved, and ruthenium can be efficiently deposited in a manner that is consistent with ALD process cycle times, even on non-metallic substrates such as silicon and/or silicon dioxide.

What is claimed is:

1. A method of forming a ruthenium metal film in a vapor deposition process, comprising depositing ruthenium from a ruthenium precursor with an assistive metal species that increases the rate and extent of ruthenium nucleation in relation to deposition of ruthenium in the absence of such assistive metal species, wherein the assistive metal species is deposited on a substrate in a layer having a thickness of 0.8 to 8 Å before the deposition of the ruthenium, and the assistive metal species is selected from the group consisting of one or more assistive metal species containing strontium metal, calcium, barium metal, magnesium, titanium metal, zirconium metal, niobium, vanadium, iron and hafnium metal.

2. The method of claim 1 wherein the ruthenium nucleation step is uniform and rapid relative to ruthenium nucleation in the absence of the assistive metal species.

3. The method of claim 1, wherein the assistive metal species is selected from the group consisting of assistive metal species containing strontium metal, calcium, barium metal, magnesium, titanium metal, zirconium metal, niobium, vanadium, iron and hafnium metal.

4. The method of claim 1, wherein the ruthenium metal film is formed in a process for manufacturing a micro-electronic device or precursor structure therefor.

5. The method of claim 1, wherein the assistive metal species is deposited on a non-metallic substrate.

6. The method of claim 5, wherein the non-metallic substrate comprises silicon and/or silicon oxide.

7. The method of claim 5, wherein the assistive metal species is deposited by a vapor deposition process selected from the group consisting of chemical vapor deposition and atomic layer deposition.

8. A method of forming a ruthenium metal film in a vapor deposition process, comprising depositing ruthenium with an assistive metal species that increases the rate and extent of ruthenium nucleation in relation to deposition of ruthenium in the absence of such assistive metal species, wherein the assistive metal species is deposited on a substrate in a layer having a thickness of 0.8 to 8 Å before the deposition of the ruthenium, and wherein the ruthenium metal is deposited on strontium-containing material.

9. The method of claim 8, wherein the strontium-containing material comprises strontium oxide and/or strontium carbonate.

10. A method of forming a ruthenium metal film in a vapor deposition process, comprising depositing ruthenium with an assistive metal species that increases the rate and extent of ruthenium nucleation in relation to deposition of ruthenium in the absence of such assistive metal species, wherein the assistive metal species is deposited on a substrate in a layer having a thickness of 0.8 to 8 Å before the deposition of the ruthenium, and wherein the assistive metal species is deposited from a precursor comprising a dicyclopentadienyl strontium precursor.

11. The method of claim 10 wherein the assistive metal species further comprises an assistive metal species selected from the group consisting of strontium, calcium, barium, magnesium, titanium, aluminum, zirconium, tantalum, niobium, vanadium, iron and hafnium.

12. A method of forming a ruthenium metal film in a vapor deposition process, comprising depositing ruthenium with an assistive metal species that increases the rate and extent of ruthenium nucleation in relation to deposition of ruthenium in the absence of such assistive metal species, wherein the assistive metal species is deposited on a substrate in a layer having a thickness of 0.8 to 8 Å before the deposition of the ruthenium, and wherein ruthenium metal is deposited on a strontium-containing film formed by atomic layer deposition from a vapor of a dicyclopentadienyl strontium precursor.

13. A method of forming a ruthenium-containing film in a vapor deposition process, comprising depositing ruthenium from a ruthenium precursor with an assistive metal species that increases the rate and extent of ruthenium nucleation in relation to deposition of ruthenium in the absence of such assistive metal species, wherein the assistive metal species is selected from the group consisting of one or more assistive metal species containing strontium, calcium, barium, magnesium, aluminum, zirconium, niobium, vanadium, iron and hafnium, wherein ruthenium is deposited with the assistive metal, from a precursor vapor comprising ruthenium and the assistive metal species, wherein, when the assistive metal species is a strontium amidinate or a barium amidinate, the ruthenium precursor is not a ruthenium amidinate, and wherein when the assistive metal species is dicyclopentadienyl calcium, strontium, or barium, the ruthenium precursor is a dicyclopentadienyl ruthenium precursor.

14. The method of claim 13, wherein the assistive metal comprises strontium.

15. The method of claim 13, wherein the assistive metal species comprises a dicyclopentadienyl strontium compound.

16. The method of claim 15, wherein the dicyclopentadienyl strontium compound comprises $Sr(^{n}PrMe_4Cp)_2$ wherein $^{n}Pr$ is n-propyl, Me is methyl and Cp is cyclopentadienyl.

17. The method of claim 13, wherein ruthenium and the assistive metal species are deposited from a precursor vapor of a precursor composition comprising strontium and ruthenium metal precursors dissolved in a solvent medium.

18. The method of claim 17, wherein the solvent medium includes a hydrocarbon solvent.

19. A method of forming a ruthenium-containing film in a vapor deposition process, comprising depositing ruthenium with an assistive metal species that increases the rate and extent of ruthenium nucleation in relation to deposition of ruthenium in the absence of such assistive metal species, wherein ruthenium and the assistive metal species are deposited from a precursor vapor of a precursor composition comprising strontium and ruthenium metal precursors dissolved in a solvent medium and wherein the ruthenium precursor comprises a dicyclopentadienyl ruthenium compound including on at least one of constituent cyclopentadienyl rings thereof a pendant Lewis base functional group that coordinates to the strontium metal center of the strontium precursor.

20. The method of claim 19, wherein the pendant Lewis base functional group comprises a functionality selected from the group consisting of amines, polyamines, ethers, and polyethers.

21. A method of forming a ruthenium-containing film in a vapor deposition process, comprising depositing ruthenium with an assistive metal species that increases the rate and extent of ruthenium nucleation in relation to deposition of ruthenium in the absence of such assistive metal species wherein ruthenium and the assistive metal species are deposited from a precursor vapor of a precursor composition comprising strontium and ruthenium metal precursors dissolved in a solvent medium, and wherein the ruthenium and strontium precursors are both dicyclopentadienyl compounds.

22. A method of forming a ruthenium-containing film in a vapor deposition process, comprising depositing ruthenium from a ruthenium precursor with an assistive metal species that increases the rate and extent of ruthenium nucleation in relation to deposition of ruthenium in the absence of such assistive metal species, wherein ruthenium is deposited with the assistive metal species, from a precursor vapor comprising ruthenium and the assistive metal species and wherein the assistive metal species is selected from the group consisting of one or more assistive metal species containing calcium, barium, magnesium, aluminum, zirconium, niobium, vanadium, iron and hafnium, wherein, when the assistive metal species is a barium amidinate, the ruthenium precursor is not a ruthenium amidinate, and wherein when the assistive metal species is dicyclopentadienyl calcium or barium, the ruthenium precursor is a dicyclopentadienyl ruthenium precursor.

23. The method of claim 22, wherein the ruthenium nucleation step is uniform and rapid relative to ruthenium nucleation in the absence of the assistive metal species.

24. The method of claim 22, wherein the ruthenium-containing film is formed in a process for manufacturing a microelectronic device or precursor structure therefor.

25. The method of claim 22, wherein the assistive metal species is deposited on a non-metallic substrate.

26. The method of claim 25, wherein the non-metallic substrate comprises silicon and/or silicon oxide.

27. A method of forming a ruthenium metal film in a vapor deposition process, comprising depositing ruthenium from a ruthenium precursor with an assistive metal species that increases the rate and extent of ruthenium nucleation in relation to deposition of ruthenium in the absence of such assistive metal species, wherein the assistive metal species is deposited on a substrate in a layer having a thickness of 0.8 to 8 Å before the deposition of the ruthenium, and the assistive metal species is selected from the group consisting of one or more assistive metal species comprising oxides, sulfides, and carbonates of strontium, calcium, barium, magnesium, titanium, aluminum, zirconium, tantalum, niobium, vanadium, iron and hafnium, wherein when the assistive metal species comprises an oxide of aluminum, hafnium, zirconium, or titanium, the ruthenium precursor does not comprise alkenyl or cycloalkenyl functionality.

28. The method of claim 27, wherein the ruthenium metal film is formed in a process for manufacturing a micro-electronic device or precursor structure therefor.

29. The method of claim 27, wherein the assistive metal species is deposited on a non-metallic substrate.

30. The method of claim 29, wherein the non-metallic substrate comprises silicon and/or silicon oxide.

31. The method of claim 29, wherein the assistive metal species is deposited by a vapor deposition process selected from the group consisting of chemical vapor deposition and atomic layer deposition.

32. The method of claim 27, wherein the assistive metal species comprises at least one species selected from the group consisting of strontium oxide, strontium carbonate, calcium oxide, calcium carbonate, magnesium oxide, magnesium carbonate, barium oxide, barium carbonate, titanium dioxide, aluminum oxide, zirconium oxide, hafnium oxide, tantalum oxide, and niobium oxide.

33. The method of claim 32, wherein ozone, water or an alcohol is present and forms an oxide of the assistive metal, and ruthenium metal film is deposited on the oxide of the assistive metal.

34. The method of claim 27, wherein an agent selected from the group consisting of ammonia, hydrogen, boranes, and carbon monoxide is present to facilitate deposition of assistive metal-containing material, and ruthenium metal film is deposited on the assistive metal-containing material.

* * * * *